United States Patent [19]

Davis et al.

[11] Patent Number: 4,687,989
[45] Date of Patent: Aug. 18, 1987

[54] CMOS POWERLESS ROM CODE MASK OPTION SELECT

[75] Inventors: Harold L. Davis, Colony; Robert D. Lee, Denton, both of Tex.

[73] Assignee: Thomson Components-Mostek Corp., Carrolton, Tex.

[21] Appl. No.: 667,182

[22] Filed: Nov. 1, 1984

[51] Int. Cl.⁴ ............................................ G01R 31/28
[52] U.S. Cl. .............................. 324/758 R; 324/73 R
[58] Field of Search .................... 324/73 R, 158 R; 29/574; 307/451, 468, 469

[56] References Cited

U.S. PATENT DOCUMENTS

| 3,982,138 | 9/1976 | Luisi et al. | 307/451 |
| 4,140,924 | 2/1979 | Oguey et al. | 307/451 |
| 4,336,495 | 6/1982 | Hapke | 324/158 R |
| 4,490,673 | 12/1984 | Blum et al. | 324/73 R |

FOREIGN PATENT DOCUMENTS 108425   6/1984   Japan .................................. 307/451

Primary Examiner—Ernest F. Karlsen
Attorney, Agent, or Firm—Roland Plottel

[57] ABSTRACT

An integrated circuit having an option between two or more configurations and also using a patterned ion-implant for impressing data (such as a ROM section of the circuit) may advantageously perform the option-specification simultaneously with the ROM; using a powerless option-specifying circuit permits testing portions of the circuit before the implantation step.

5 Claims, 3 Drawing Figures

FIG. 1 PRIOR ART
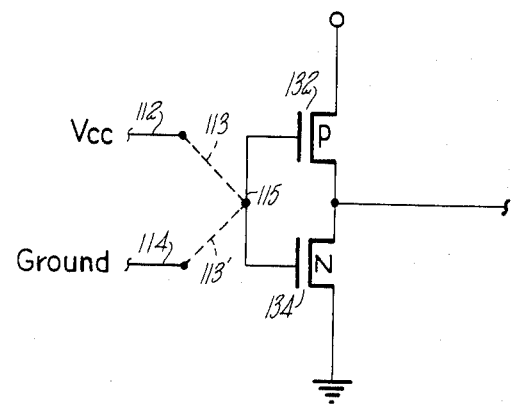
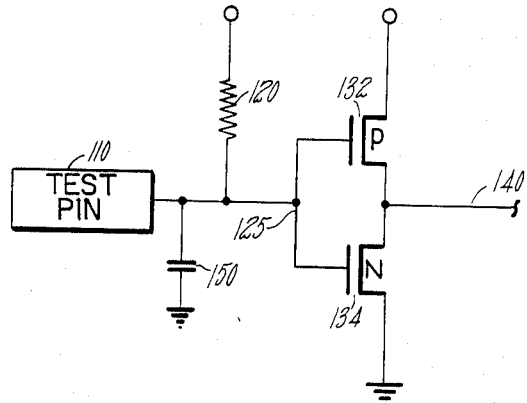
FIG. 2

CMOS POWERLESS ROM CODE MASK OPTION SELECT

TECHNICAL FIELD

The field of the invention is that of CMOS integrated circuit ROMs, in particular a circuit that is testable before applying a customizing ion implant.

BACKGROUND ART

Many integrated circuits allow for the ability to specify among one or more optional features. Particular options are the use of inverting or noninverting address inputs, the number of bits in a word, and any number of other features. These options have been implemented in the past by making or not making connections in the metal level. This method has the drawback, however, that the circuit is not testable before the options are specified because the part is inoperative without the metal layer.

DISCLOSURE OF INVENTION

The invention relates to an option - specifying circuit for a CMOS ROM that draws zero power in either of two states and is also testable before the step of implanting the ROM code.

BRIEF DESCRIPTION OF DRAWINGS

FIG. 1 illustrates a prior art circuit.
FIG. 2 illustrates an embodiment of the invention.

BEST MODE OF CARRYING OUT THE INVENTION

Figure 3:
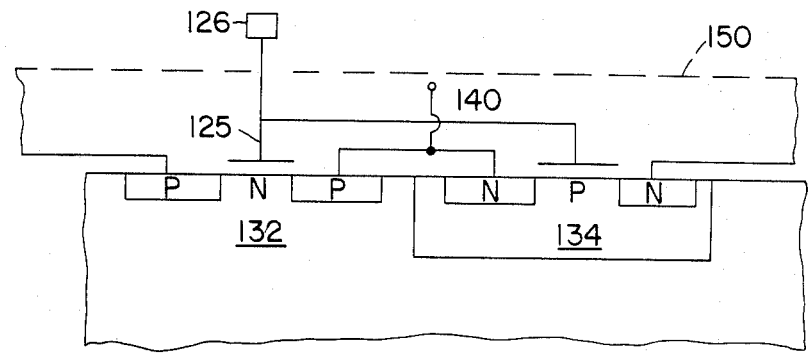
FIG. 3 shows schematically a semiconductor substrate including the integrated circuit shown in FIG. 2.

In the case of a ROM circuit, it would be attractive to specify customized options on the mask that is used to specify the ROM code, since the ROM code mask must be customized anyway and the additional cost to further customize the ROM code is negligible. In the case of a CMOS ROM, the option selection circuit should preferably draw no power in order to keep the current drain of the part at a minimum value.

A prior art circuit is illustrated in FIG. 1, in which P-channel transistor 132 is connected between Vcc, indicated conventionally by an open circle, and an output node and N-channel transistor 134 is connected between the output node and ground. Both transistors 132 and 134 have a common gate node 115 that may be connected to either Vcc line 112 or to ground line 114 by one of optional metal lines 113 or 113' respectively. This circuit controls the output node in a straightforward manner. As was explained above, this circuit has the substantial commercial disadvantage that it cannot be tested before being customized, since the integrated circuit is not operable without the metal interconnections.

Referring now to FIG. 2, a circuit constructed according to the invention comprises a single test pin 110 connected through gate node 125 to a simple CMOS inverter comprising two transistors. A DC voltage is applied to the common gate for the two transistors through resistor 120 connected between Vcc and the gate. P-channel transistor 132, connected in series between Vcc and output node 140, and N-channel transistor 134, connected between output node 140 and ground, are both controlled by gate node 125 to have a nominal default state in which transistor 132 is off and transistor 134 is on, so that output node 140 is normally close to ground. Output node 140 will be connected to the gate of some transistor, so that a circuit is enabled or disabled, depending on the state of node 140. The controlled circuits are conventional and form no part of this invention.

Before the ROM code implant is performed, at a stage in the processing when the circuit is electrically complete, the circuit may be tested by switching the voltage on test pin 110 between Vcc and ground. Since the value of resistor 120 is high, the voltage on test pin 110 will control node 140 by dominating gate node 125. There will be some trip point voltage at which the voltage on node 140 will switch from one state to the other. The exact value of the voltage will depend on processing details.

When the ROM code is applied, the state of node 140 will be set. If it is desired to leave node 140 at a low voltage, then transistors 132 and 134 are masked to block the ROM implant. If it is desired to have node 140 at a high voltage, then both transistors 132 and 134 will receive a standard boron implant dose having a magnitude sufficient to turn N-channel transistor 134 off even though gate node 125 rises to the full value of Vcc; i.e. to raise the threshold of transistor 134 above $+5$ V. In this application the term fixing the option, or fixing the inverter to remain in a certain state will be used to refer to the alternatives of masking the inverter to preserve the default state and implanting the inverter to establish the alternative state. The implant dose also has a magnitude sufficient to keep P-channel transistor 132 on, even though gate node 125 rises to the full value of Vcc. In that case, output node 140 will have a steady value of Vcc. This same condition may be expressed as saying that the trip point voltage is above Vcc.

The exact magnitude of the implant dose will depend on the particular process used. For a process using Vcc=5 volts and a substrate having a resistivity of 10–20 ohm-cm and N-well doping of $5 \times 10^{12}/cm^2$ having a 4 micron junction depth, a dose of double charged boron of $10^{13}$ ion/cm$^2$ implanted at 150 Kev is suitable. Those skilled in the art will readily be able to vary these parameters to suit their particular requirements.

Thus, this circuit satisfies the requirements specified above: it is testable before the ROM code implant is performed and it draws no power in either of the two states that it may assume after the ROM code implant is performed.

In a preferred embodiment of the invention, the "overhead" circuitry handling the auxiliary functions of the ROM is electrically complete, i.e. having functioning transistors and interconnects between them, so that not only the option-setting circuit but other functions such as decoders and the like may also be tested. Test pin 110 and any other test pins will, of course, have to be accessible, i.e. not covered by any glass, polyimide or other protective layer. The details of actual tests performed do not form part of the invention. The test may be as simple as checking for excess power consumption or may involve the application of standard input test data such as inputting an address to check decoder operation and the like. Designing a circuit for testability is a well-known process, familiar to those skilled in the art. Those skilled in the art will readily be able to apply this invention to other standard logic circuits such as NAND gates, OR gates and the like. Other variations that will be evident to those skilled in the art include the use of a pull-up transistor as resistive element 120, the size of the transistor being selected to provide an effective impedance. Further, the DC voltage on gate node 125 may be ground instead of the power supply voltage or some intermediate reference voltage. If gate node 125 is normally at ground, then the undoped state will have transistor 134 off and output node 140 at Vcc and the doping will be altered to keep transistor 134 on.

An optional capacitor 150 is also shown in FIG. 2. If noise pulses leak in along the ground, Vcc, or nearby signal lines gate node 125 may momentarily cross the threshold for switching output node 140 to the opposite state. There will always be some minimum charge transfer required to shift node 140, determined by the stray capacitance of gate node 125. If that amount of charge is insufficient to guard against inadvertent momentary switching of output node 140, a designer may add a capacitor 150 in order to provide further protection.

In FIG. 3, there is shown a semiconductor substrate which includes an integrated circuit including a pair of complementary transistors 132 and 134 whose gates are both connected and a common gate node 125 which is connected to a test pin 126 which extends outside the various protective coatings typically used over the surface of the integrated circuit and indicated schematically by the broken line 150 and an optin node 140 connected at the node between the two transistors as characteristic of the invertor shown in FIG. 2.

We claim:

1. A testable CMDS integrated circuit for specifying a circuit parameter by maintaining a preselected option node at a predetermined static voltage, comprising:
    a semiconductor substrate having an electrical circuit formed therein, said electrical circuit having at least one option node for forcing a subcircuit of said electrical circuit into a predetermined state dependent on a voltage at said option node;
    a P-channel transistor connected between a power supply voltage terminal and said option node;
    an N-channel transistor connected between said option node and ground;
    a gate node common to both of said P-channel and N-channel transistors; and
    voltage means connected to said gate node for supplying a steady-state voltage to said gate node; characterized in that:
    said voltage means comprises a resistive element, having a predetermined resistance, connected between said gate node and a current supply terminal;
    said circuit further comprises a test pin, exposed outside any covering layers of said integrated circuit and connected directly to said gate node, whereby voltage supplied to said test pin may override said voltage means to control said gate node.

2. An integrated circuit according to claim 1, further characterized in that said current supply terminal is a power supply terminal and the two transistors form an inverter.

3. An integrated circuit according to claim 1, further characterized in that a capacitor having a predetermined capacitance is connected between said gate node and ground, whereby said predetermined static voltage on said option node is insulated from voltage fluctuations on said gate node.

4. An integrated circuit according to claim 1, further characterized in that said gate node has a trip point voltage separating first and second voltage ranges controlling first and second voltage states of said option node respectively in which said trip point voltage is above said steady-state voltage on said gate node, whereby said option node is in said first voltage state.

5. An integrated circuit according to claim 1, further characterized in that said gate node has a trip point voltage separating first and second voltage ranges controlling first and second voltage states of said option node respectively in which said trip point voltage is below said steady-state voltage on said gate node, whereby said option node is in said second voltage state.

* * * * *

UNITED STATES PATENT AND TRADEMARK OFFICE
CERTIFICATE OF CORRECTION

PATENT NO.   :   4,687,989

DATED        :   August 18, 1987

INVENTOR(S)  :   Harold L. Davis; Robert D. Lee

It is certified that error appears in the above-identified patent and that said Letters Patent is hereby corrected as shown below:

In column 3, line 26, please delete "optin" and substitute therefor --option--.

In column 3, claim 1, line 31, please delete "CMDS" and substitute therefor --CMOS--.

Signed and Sealed this

Twenty-fifth Day of August, 1992

Attest:

DOUGLAS B. COMER

Attesting Officer

Acting Commissioner of Patents and Trademarks